United States Patent [19]
Steigerwald et al.

[11] Patent Number: 6,150,895
[45] Date of Patent: Nov. 21, 2000

[54] CIRCUIT BOARD VOLTAGE PLANE IMPEDANCE MATCHING

[75] Inventors: Todd W. Steigerwald; Mitchell C. Sebring, both of Austin, Tex.

[73] Assignee: Dell USA, L.P., Round Rock, Tex.

[21] Appl. No.: 09/236,706

[22] Filed: Jan. 25, 1999

[51] Int. Cl.[7] ..................................................... H01P 1/00
[52] U.S. Cl. ............................... 333/12; 333/33; 333/34; 361/818
[58] Field of Search ............................. 333/12, 33, 34, 333/35, 246; 174/250–255; 361/780, 818

[56] References Cited

U.S. PATENT DOCUMENTS

| | | | |
|---|---|---|---|
| 4,760,400 | 7/1988 | Lait | 333/35 X |
| 4,927,742 | 5/1990 | Kohm | 430/311 |
| 5,010,641 | 4/1991 | Sisler | 29/830 |
| 5,025,116 | 6/1991 | Kawakami et al. | 174/250 |
| 5,030,800 | 7/1991 | Kawakami et al. | 174/264 |
| 5,079,069 | 1/1992 | Howard et al. | 428/209 |
| 5,112,648 | 5/1992 | Okonogi et al. | 427/96 |
| 5,140,110 | 8/1992 | Nakagawa et al. | 174/250 |
| 5,155,655 | 10/1992 | Howard et al. | 361/303 |
| 5,161,086 | 11/1992 | Howard et al. | 361/321 |
| 5,173,150 | 12/1992 | Kanaoka et al. | 156/630 |
| 5,196,230 | 3/1993 | Okonogi et al. | 427/96 |
| 5,236,736 | 8/1993 | Kawakami et al. | 427/96 |
| 5,261,153 | 11/1993 | Lucas | 29/830 |
| 5,262,596 | 11/1993 | Kawakami et al. | 174/261 |
| 5,291,653 | 3/1994 | Ichikawa | 29/846 |
| 5,293,004 | 3/1994 | Kawakami et al. | 174/250 |
| 5,315,069 | 5/1994 | Gebara | 174/250 |
| 5,324,766 | 6/1994 | Ikejiri et al. | 524/433 |
| 5,416,667 | 5/1995 | Ichikawa et al. | 361/816 |
| 5,418,690 | 5/1995 | Conn et al. | 361/794 |
| 5,428,506 | 6/1995 | Brown et al. | 361/794 |
| 5,494,781 | 2/1996 | Ohtani et al. | 430/313 |
| 5,500,789 | 3/1996 | Miller et al. | 361/816 |
| 5,633,479 | 5/1997 | Hirano | 174/255 |
| 5,635,767 | 6/1997 | Wenzel et al. | 257/778 |
| 5,639,989 | 6/1997 | Higgins, III | 174/35 MS |
| 5,682,124 | 10/1997 | Suski | 333/1 |
| 5,841,074 | 11/1998 | Egan et al. | 174/250 |
| 5,912,597 | 6/1999 | Inagawa et al. | 333/12 X |
| 5,912,809 | 6/1999 | Steigerwald et al. | 333/12 X |
| 5,926,377 | 7/1999 | Nakao et al. | 333/12 X |
| 5,966,294 | 10/1999 | Harada et al. | 174/250 X |

OTHER PUBLICATIONS

Howard W. Johnson and Martin Graham, *"High–Speed Digital Design: A Handbook of Black Magic"*, 1993, pp. 189–221.

*Primary Examiner*—Paul Gensler
*Attorney, Agent, or Firm*—Skjerven Morrill MacPherson LLP; David G. Dolezal

[57] ABSTRACT

A circuit board having a transition region at its perimeter. The transition region provides a deliberate increase in impedance between the voltage and ground plane from the interior side of the transition region where the board impedance is approximately that of the board impedance at an interior region of the circuit board to the edge side of the transition region where the impedance level approximates or is slightly less than that of surrounding air. In one example, the voltage plane in the transition region has a geometric configuration that provides a decrease in plane material (such as a hole, stripe, or triangle pattern) from the interior side to the edge side of the transition region. With other examples, the distance between the voltage and ground plane increases from the interior side to the edge side of the transition region.

43 Claims, 12 Drawing Sheets

$Z_0 < Z_T(X) < Z_A$

WAVE IMPEDANCE MAP

Circuit Board To Free Space Abrupt Transition

WAVE IMPEDANCE MAP

OFFSET POWER PLANE

CIRCUIT BOARD VOLTAGE PLANE IMPEDANCE MATCHING

BACKGROUND OF THE INVENTION

1. Field of the Invention

This invention relates to electronic systems and more specifically to circuit boards for electronic systems.

2. Description of the Related Art

Electronic systems such as computer systems inherently generate Electromagnetic (EM) fields. All EM fields are originally sourced by the active electronic components in the system, but are delivered into space as Electromagnetic Interference (EMI) by various system structures which act as antennas. Three sources of EMI in a computer system are:

1) Circuit board—differential and common mode EM fields from circuit board traces and planes which may also be referred to as back-plane radiation.

2) Cabling—differential and common mode EM fields from flex circuits, internal cabling, or external cabling.

3) Integrated circuits(ICs)—EM fields associated with IC(s). Each source contributes to the overall EMI emissions profile of a computer system.

A type of EMI radiation generated by a circuit board during the operation of a computer system is commonly referred to as transverse electromagnetic mode (TEM) radiation or TEM waves. During the operation of a computer system, RF currents are generated by sources such as alternating clock currents transmitted through the circuit board traces and by instantaneous current changes in the electronic board components such as IC chips. These complex RF currents travel along and between the power planes and produce EM emissions at the circuit board edges, some of which are emitted as TEM waves. TEM wave radiation is generated from these RF currents through differential voltage disturbances between two or more power planes embedded within the circuit board. The RF differential voltage at the power plane edges generates electromagnetic waves through the air to ground following a co-linear, parallel plate, transmission line model, with fringing occurring at the open circuit end of the parallel plate transmission line.

An electromagnetic interference (EMI) shield (e.g. a metal chassis) in a computer system is designed to contain EM waves produced by EM sources in the computer system and/or to exclude external EM waves from external EM sources. With a typical EMI shield, radio frequency (RF) electrical currents originating from the circuit traces and electronic components induce EM waves or fields that are absorbed by the shield (A), reflected by the shield (R). The rest of the EM waves are transmitted by the shield. Shielding effectiveness (SE), which is expressed in dB, follows:

$$SE^{(dB)} = A^{(dB)} + R^{(dB)}.$$

$$SE^{(dB)} = 20 \log F1/F2^{(dB)}.$$

where F1 is the wave field strength of the EM source, and F2 is the wave field strength of the portion re-transmitted by the shield.

The higher the EM fields generated by the system, the higher the required SE to reduce the portion of the EM fields re-radiated by the shield. Increasing the SE typically is accomplished by increasing the thickness of the metal panels of a metal shield or increasing the thickness of metallic coating on the outer plastics of the computer system, either of which increases the cost, complexity, and/or weight of the system. Furthermore, designing a shield with a high SE requires interface structures built within high tolerances to prevent EM waves from leaking through the shield via openings in the shield such as openings for receiving external data and power signals. These high tolerance interface structures also add to the cost and/or complexity of a computer system. Because of these and other disadvantages, it is desirable to reduce the EM radiation generated by the electronic system on or within a circuit board.

The Federal Communications Commission (FCC) in the United States and other international agencies set standards for the maximum intensity of electromagnetic energy which can be radiated and conducted in specific electromagnetic bands from a computer system. Accordingly, it is desirable to reduce the TEM waves generated from the edge of a circuit board in order to reduce the overall EMI emissions generated by a computer system or other electronic system during its operation.

SUMMARY OF THE INVENTION

It has been discovered that providing a circuit board with an edge transition region having a deliberate increase in the impedance between a first power plane and a second power plane advantageously decreases the intensity of the EM waves generated from the edge of the circuit board.

Reducing the EM waves generated from the edge of a circuit board provides an electronic system such as a computer system with a number of advantages. Because less EM radiation is produced, less shielding is required for the system, thereby enabling an electronic system to be manufactured with less metal or with a reduced amount of metallic coating. In addition, reduced EMI emissions allow the system to be built with less expensive materials or with less complex shielding structures resulting in a reduced overall weight which is especially important for portable products.

In one aspect of the invention, a circuit board includes a first conductive plane and a second conductive plane. An impedance between the first conductive plane and the second conductive plane at an interior region of the first conductive plane is at a first impedance level. The circuit board also includes means for providing a deliberate increase in the impedance between the first conductive plane and the second conductive plane from approximately the first impedance level towards the impedance level of surrounding air so as to reduce intensity of electromagnetic waves generated from an edge of the circuit board.

In another aspect of the invention, a circuit board includes a first power plane and a second power plane. An impedance between the first power plane and the second power plane at an interior region of the circuit board is at a first impedance level. The circuit board also includes a transition region located along an edge of the circuit board. The transition region has an interior side and an edge side. Portions of the first and second power planes extend into the transition region. The impedance between the first power plane and the second power plane has a deliberate increase from approximately the first impedance level at the interior side of the transition region to a higher impedance level at the edge side of the transition region so as to reduce intensity of electromagnetic waves generated from the edge of the circuit board.

In another aspect of the invention, a circuit board includes a first conductive plane and a second conductive plane. An impedance between the first conductive plane and the second conductive plane at an interior region of the first conductive plane is at a first impedance level. The first conductive plane further includes a transition region located at an edge region of the first conductive plane adjacent to the interior region. The transition region has a geometric configuration for providing a deliberate increase in the impedance between the first conductive plane and the second conductive plane from approximately the first impedance level towards a higher impedance level.

In another aspect of the invention, a computer system having a processor and a system memory includes a circuit board. The circuit board includes a first power plane and a second power plane. An impedance between the first power plane and the second power plane at an interior region of the circuit board is at a first impedance level. The circuit board includes a dielectric layer positioned between the first power plane and the second power plane and a transition region located along an edge of the circuit board. The transition region has an interior side and an edge side. Portions of the first and second power planes extend into the transition region. The impedance between the first power plane and the second power plane has a deliberate increase from approximately the first impedance level at the interior side of the transition region to a higher impedance level at the edge side of the transition region so as to reduce intensity of electromagnetic waves generated from the edge of the circuit board.

BRIEF DESCRIPTION OF THE DRAWINGS

The present invention may be better understood, and its numerous features and advantages made apparent to those skilled in the art by referencing the accompanying drawings.

The use of the same reference symbols in different drawings indicates similar or identical items.

DETAILED DESCRIPTION

The following sets forth a detailed description of a mode for carrying out the invention. The description is intended to be illustrative of the invention and should not be taken to be limiting.

Figure 1:
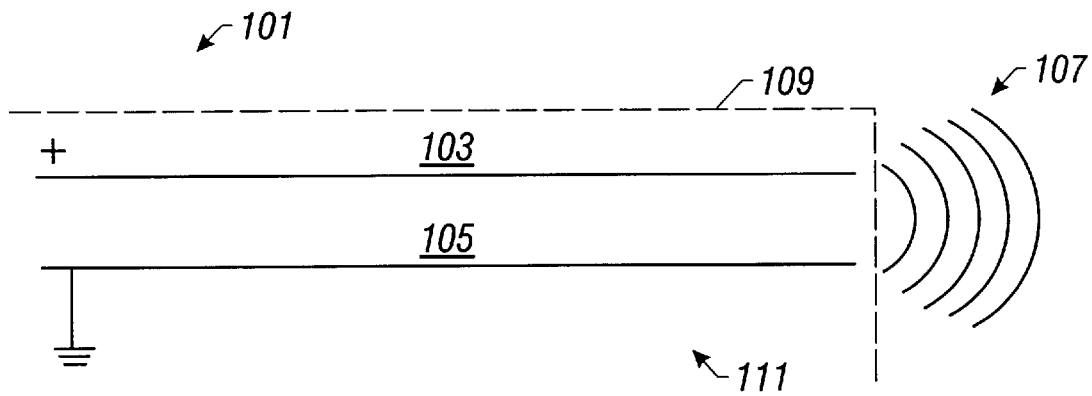
FIG. 1 is a side view of a prior art circuit board with non offset power plane (VCC and Ground) edges.

FIG. 1 shows a side view of a prior art circuit board which can be used in a computer system or other electronic system. The circuit board 101 includes two power planes, a voltage plane 103 and a ground plane 105, embedded in the circuit board. The voltage plane 103 (such as a VCC plane) may be at a positive or a negative voltage potential (e.g. +5 VDC or −5 VDC). The voltage plane typically provides a voltage potential to electronic components of the electronic system incorporating the circuit board. Between the power planes is a layer of dielectric material such as prepreg. The outer surface of the circuit board 101 is shown in dashed lines.

Not shown in FIG. 1 (or in FIGS. 2–16) are other conventional items found on circuit boards such as 1) components located on the planar sides 109 or 111 e.g. ICs, other surface mounted electronic components, and electrical traces; 2) embedded structures e.g. plated vias, embedded conductive signal layers, and other embedded power planes; and 3) attachment or mounting mechanisms e.g. screw holes and shielding connectors. These conventional items are not shown in the Figures of this application in order to more clearly illustrate the inventive aspects of the circuit boards. However, it is understood that circuit boards according to the present invention may incorporate some or all of the items as well as other items conventionally found on circuit boards.

During the operation of a computer system or other electronic system incorporating circuit board 101, TEM waves are generated from the edge of the circuit board 101 by RF currents in the parallel plane structure of the voltage 103 and ground 105 planes. The resultant EM wave profile 107 of the edge generated waves follows the model of co-linear, parallel plate, transmission line. The free air capacitance to ground completes the circuit (the receiver) in a similar manner to that of an intentional radio transmitter.

Figure 2:
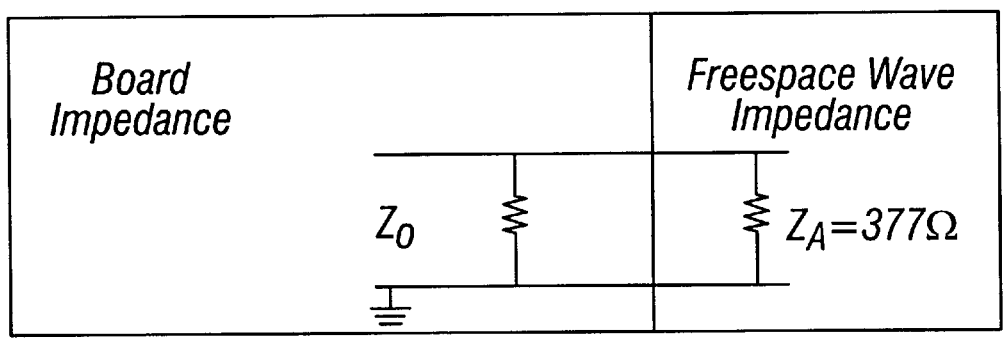
FIG. 2 is a wave impedance map of a side of a prior art circuit board.

FIG. 2 is a wave impedance map of the side of a prior art circuit board. An RF "induction region" or "impedance transition region" occurs at the abrupt impedance mismatch between the board impedance $Z_o$ (the impedance between the power planes) and the free space wave impedance $Z_a$ (approximately 377 Ω) of the surrounding air. Typical board impedance values may range from less than 10 miliohms to more than 75 ohms. RF electrical currents in the power planes generate edge EM emissions to the surrounding air at the abrupt impedance mismatch. Generally, this approach to building a circuit board maximizes the power planes' transmitting efficiency of delivering TEM RF waves to surrounding free space, which is not desirable.

The power plane structure will have several natural resonances based upon its physical dimensions. A standing wave resonance occurs when the EMI source has a wavelength $\lambda$ equal to one of the significant dimensions of the circuit board such as, for example, width or length for a rectangular board.

A high "Q" or resonance potential is achieved when the source frequency or a harmonic of the source frequency is very close to one of the circuit board's natural resonance frequencies such that:

$$\lambda = c/f$$

where c=speed of light; f=frequency of main resonance; and $\lambda$=wavelength of the electromagnetic TEM wave. The speed of light may be $3 \times 10^8$ m/s or less depending on the type of media.

Some circuit boards (such as a motherboard in a desktop computer system) have a resonant frequency of approximately 200 MHz. For smaller circuit boards (such as a system board for a portable computer system), the resonant frequency is as high as 600 MHz or more. If a clock harmonic is also present at or near these resonant frequencies, the system can easily fail FCC limits. The tuned center frequency for each power plane circuit is a function of a number of parameters such as the size and shape of the circuit board power planes, the value and effective complex impedance of the power planes, the dielectric constant of the intermediate dielectric layer, and the separation between the voltage and ground planes.

For a circuit board having two solid, parallel plate power planes, the circuit board has one Q frequency. A circuit board with rectangular (length not equal to width) power planes has two Q frequencies, with the particular Q frequency depending upon which edge of the power plane the TEM wave emanates.

Figure 3:
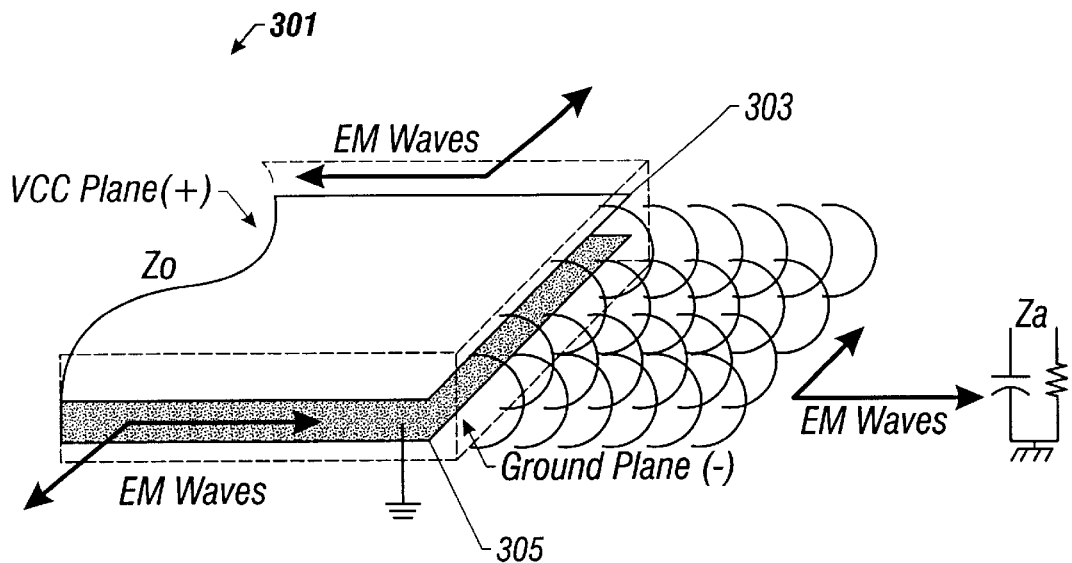
FIG. 3 is a phantom perspective view of a prior art circuit board including power planes.

FIG. 3 shows a perspective view of a prior art circuit board. In addition to showing the edge wave profile, FIG. 3 also shows the propagating direction of the generated EM waves. During the operation of a computer system incorporating circuit board 301, EM radiation generated from ICs (e.g. a system processor) and signal traces propagate as RF differential currents and voltages between the voltage plane 303 and ground plane 305 to the edge of the circuit board. The largest voltage or current component of the generated waves occurs at the Q frequency of the power planes. When these voltage waves reach the abrupt impedance mis-match at the edge of the circuit board, they generate EM waves as per the co-linear, parallel plate, transmission line model. In general, the relationship between RF current ($I_{RF}$) and strength of the voltage field (E) is $I_{RF}=E/Z_o$ where $Z_o$ is the board impedance.

Figure 4:
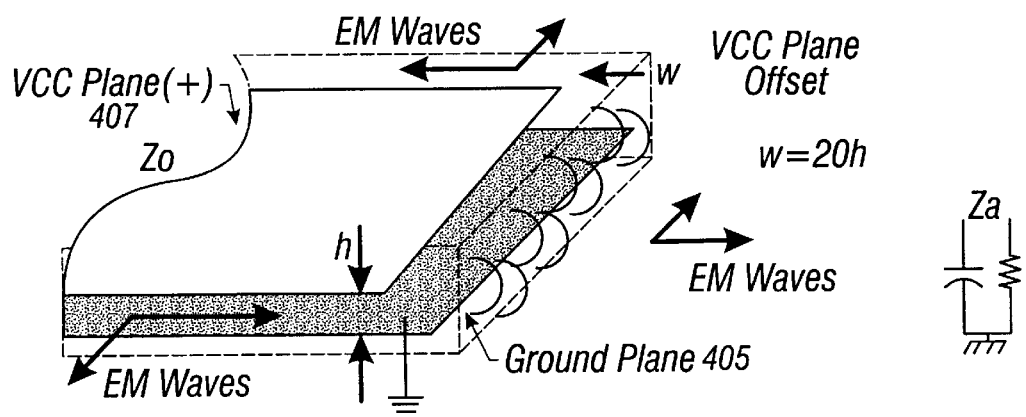
FIG. 4 is a perspective view of a prior art circuit board incorporating offset power plane edges.

Referring to FIG. 4, a prior art technique for reducing TEM waves generated from the edge of the circuit board is to offset the ground plane 405 from the voltage plane 407. An example of this technique is shown in U.S. Pat. No. 5,500,789, entitled "Printed Circuit Board EMI Shielding Apparatus And Associated Methods" which is hereby incorporated by reference in its entirety. TEM waves generated or launched from the edge of the voltage plane 407 are "captured" by the further extending ground plane 405 and returned to the system ground. However, even with an offset ground plane, a significant amount of EMI radiation is still generated from the edge of the circuit board.

Figure 5:
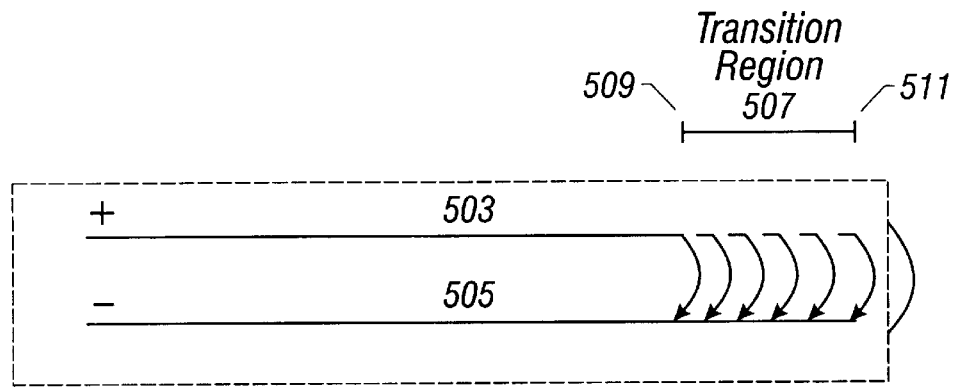
FIG. 5 is a side view of a circuit board according to the present invention.

FIG. 5 shows a side view of a circuit board according to the present invention. Voltage plane 503 includes a transition region 507 located at the edge of the voltage plane. Transition region 507 has a geometric pattern that produces a deliberate increase in the impedance between the voltage plane 503 and the ground plane 505 in the transition region 507 from the interior side 509 of the transition region to the edge side 511 of the transition region. The transition region provides a deliberate increase in the board impedance from an impedance value at the interior of the board to an impedance value that "matches" the impedance of the surrounding air at the edge of the board so as to reduce the EM waves generated from the edge of the circuit board. The transition region provides a deliberate increase in board impedance based on the geometric pattern which is applied to the edge of the voltage plane. A result of this deliberate increase in impedance is a reduction in RF current between the beginning of the transition region and the edge of the circuit board. Additionally, the "Q" of the entire circuit board is decreased in amplitude because there is no longer an abrupt impedance differential between the circuit board edge and free space.

Figure 6:
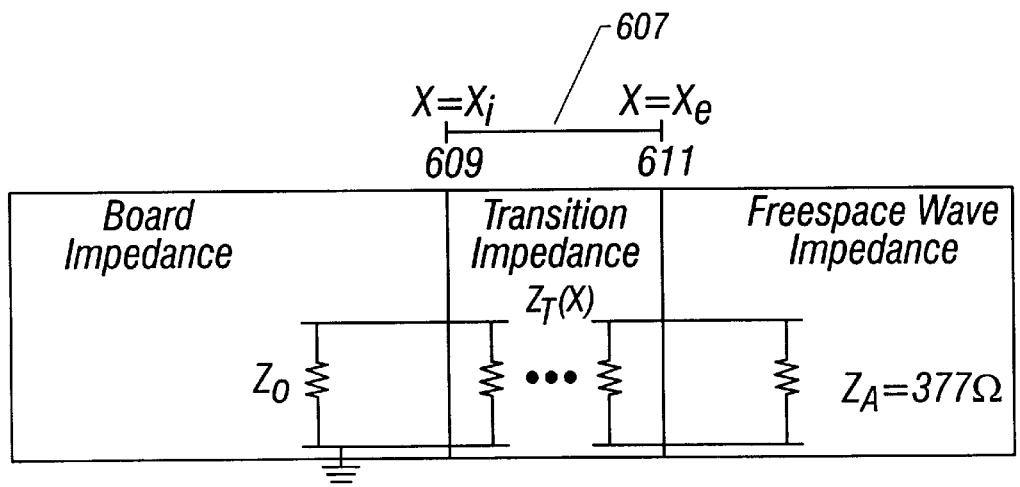
FIG. 6 is a wave impedance map of a side of a circuit board according to the present invention.

FIG. 6 is a wave impedance map of a side of a circuit board according to the present invention. $Z_o$ is the board power plane impedance, or the impedance between the voltage and ground planes, at an interior region of the power planes. The transition region broad impedance $Z_t(X)$ deliberately increases from approximately the value of $Z_o$ at the interior side 609 (where $Z_t(X_{interior})$ approximately equals $Z_o$) towards the impedance of the surrounding air $Z_a$ at the edge side 611 of the transition region 611. For most circuit boards, the impedance value $Z_t(X_{edge})$ at the edge side of the transition region may range from being slightly less (2 or 3 ohms) than $Z_a$ to somewhat less (10 ohms) depending upon the practical constraints and desired reduction in EM field intensity. Preferably, $Z_t(X_{edge})$ is to be no less than 377 Ohm.

Referring back to FIG. 5, RF currents generated by ICs and traces located at an interior of the circuit board propagate along the voltage plane 503 towards the transition region 507. As RF current enters the transition region and approaches the edge side 511 of the transition region, the geometric pattern provides a deliberate increase in the impedance between the power planes 503 and 505, which corresponds to providing an RF voltage drop to forming TEM waves. Correspondingly, certain frequencies of RF current from the voltage power plane select the path into the ground plane 505 prior to reaching the edge side 511 of the transition region. The overall effect of this transition region is to provide a low pass filter function utilizing inter-planar inductance and bi-planar capacitance which significantly attenuates high frequency emissions. See FIG. 7A. By the time the remaining portions of the RF current reach the end of the transition region, the successive reduction in RF current in the transition region significantly reduces the power associated with the RF current at the edge side 511 of the transition region 507 such that the EM waves generate from the RF current reaching the edge are significantly reduced as well.

Figure 7A:
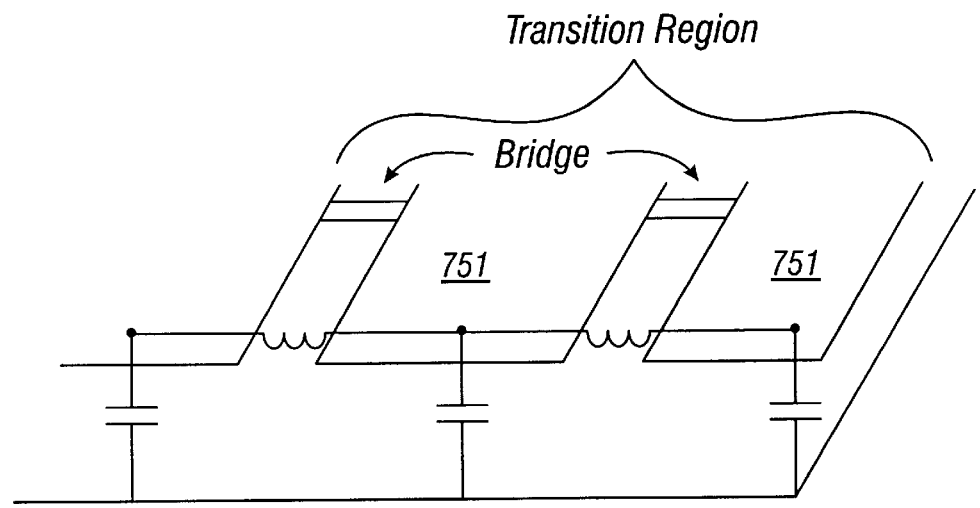
FIG. 7A is a diagram showing a low pass filter function of a transition region according to the present invention.

Referring to FIG. 7A, the "poles" of the low pass frequency function can be adjusted by manipulating the inductance values of the transition region. In FIG. 7A, the inductance values of the resultant low pass filter can be adjusted by varying the width between the stripes 751 of the power plane.

Figure 7B:
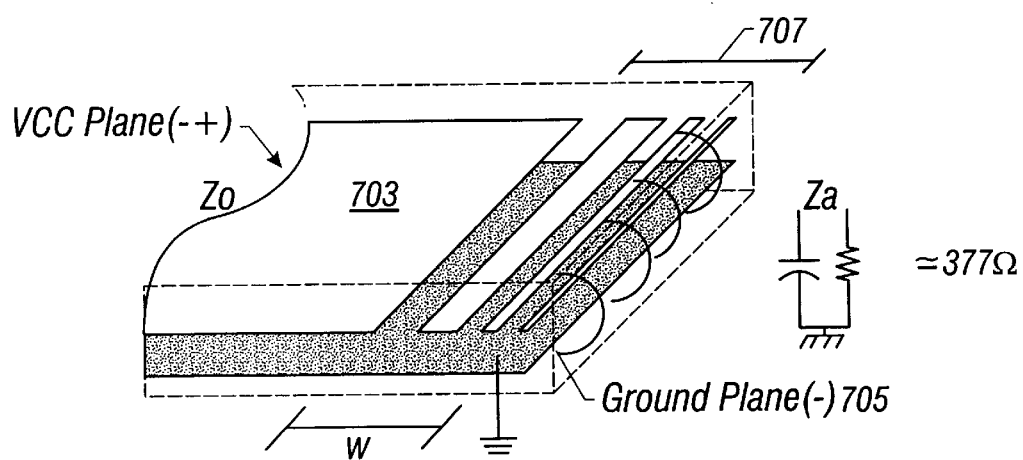
FIG. 7B is a phantom perspective view of a circuit board according to the present invention.

FIG. 7B shows a perspective view of a circuit board according to the present invention. Transition region 707 of voltage plane 703 has a geometric configuration that provides a deliberate increase in the impedance between the voltage and ground planes 703 and 705 from the interior side of the transition region to the edge side of the transition region. It is understood that the individual segments of the transition region of the voltage plane 707 would be electrically coupled together.

In one example, the width of the transition region is approximately ¼ inch. However, a transition region width for other circuit boards may range from 0.1"<W<3.0". Still other circuit boards may have transition regions of greater or lesser widths. One factor for determining the appropriate width of the transition region is the main circuit board resonance frequency of the voltage power plane structure. The lower the main circuit board resonance frequency, the greater the required width to significantly reduce the generated waves. For all frequencies of interest, a minimum desired width of a transition region is:

$$W_{(mm)} = 20 * h_{(mm)}$$

where h is the separation of the voltage plane and the ground plane.

For a maximum effective width, or the width in which no further reduction effect may be obtained, the width of a transition region is:

$$W_{max}(mm) = \frac{7.5 * 10^{10}}{f_{HZ}}$$

where $f$ is the frequency of interest. For a circuit board with an inter-planar distance of 0.125 mm and desired maximum impact at 1000 MHz, the minimum desired transition region width is:

$$W_{min} = 20^{(0.125)} (mm)$$

$$W_{min} = 2.5_{(mm)}$$

The maximum effective width for such a board would be:

$$W_{min} = 75_{(mm)} \text{ or } 7.5_{(cm)}$$

At low frequencies such as in the hundreds of kilohertz range, the wavelengths are too large to practically provide an effective transition region to reduce EM waves at those frequencies. However, such low frequencies are typically well below the Q frequency of the voltage/ground plane structure such that the component of the EM waves generated at such frequencies is insignificant. Furthermore, the lower the frequency, the lower the required tolerance is for the connector openings of the EMI shield. For an electronic system where space is at a premium (e.g. a portable computer), the width of the transition region is preferably just wide enough to be effective in reducing edge generated waves at the Q frequency or at other frequencies that make up a significant component of the EMI profile (e.g., the system processor clock frequencies). However, one advantage of the present invention is that it is effective in reducing edge waves at high frequencies which require a containment shield to be very robust, have minimal seams, and have maximized edge-to-edge contact.

Figure 8C:
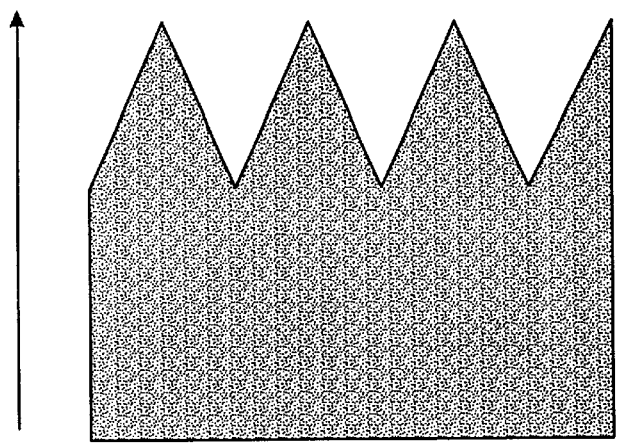
FIGS. 8A, 8B, and 8C are top views of power plane transition region geometric configurations according to the present invention.
Figure 8B:
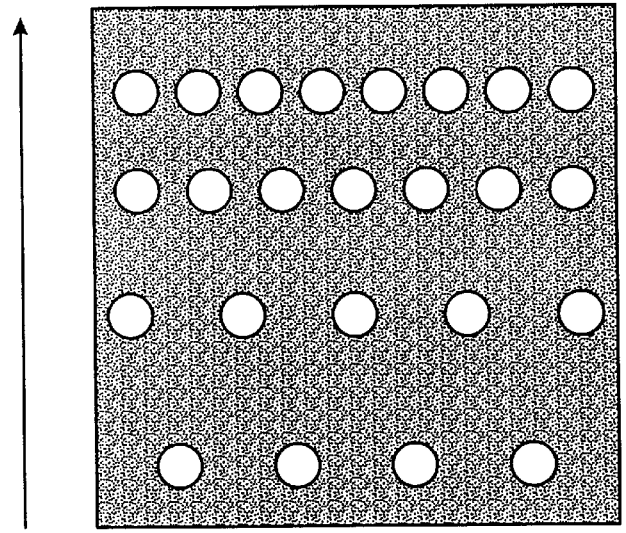
Figure 8A:
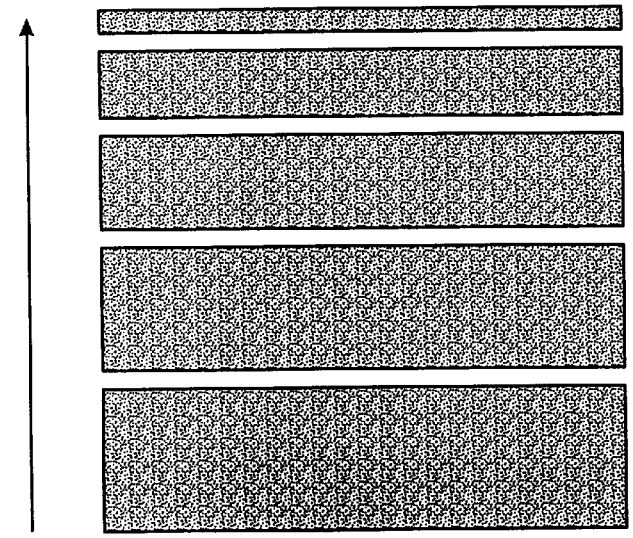

In FIGS. 8A, 8B, and 8C show top views of three exemplary geometric configurations of voltage plane transition regions for providing a deliberate increase in the impedance between a voltage and ground plane. The right sides of FIGS. 8A, 8B, and 8C are located towards the edge side of the transition region and the left sides are located towards an interior side of the transition region. As shown in FIGS. 8A, 8B, and 8C, geometric configurations of a transition region of a voltage plane that provide a deliberate increase in board impedance from the interior side to the edge side typically have a decrease in density of plane material (or an increase in void space) from the interior side to the edge side. For example, the geometric configuration in FIG. 8B includes a plurality of holes that increase in density from the interior side to the edge side of the transition region. Likewise, for the triangle (also referred to as stealth) transition region in FIG. 8C, the bases of the triangles are located towards the interior side of the board and the pointed ends are oriented towards the edge side of the board. This decrease in the density of plane material provides a deliberate increase in the board impedance in the transition region going from the interior side of the transition region towards the edge side of the transition region.

FIGS. 9 through 14 are perspective views showing the positional orientation between power planes embedded in a circuit board. These Figures illustrate exemplary transition region geometric configurations for providing a deliberate increase in the impedance from an interior side of a transition region to an edge side of the transition region. The width of the transition regions in FIGS. 9–14 have been disproportionately exaggerated with respect to the width and length of the power planes so as to more clearly illustrate the geometric configuration of the transition region. Also not shown in FIGS. 9–14 are holes and other spaces in the power plane that allow for plated vias and other circuit board structures to pass though the circuit board. These conventional holes or spaces are not shown in the Figures of this application in order to more clearly illustrate the inventive aspects of the circuit boards according to the present invention. However it is understood that the circuit boards according to the present invention may include these conventional holes or spaces.

Figure 9:
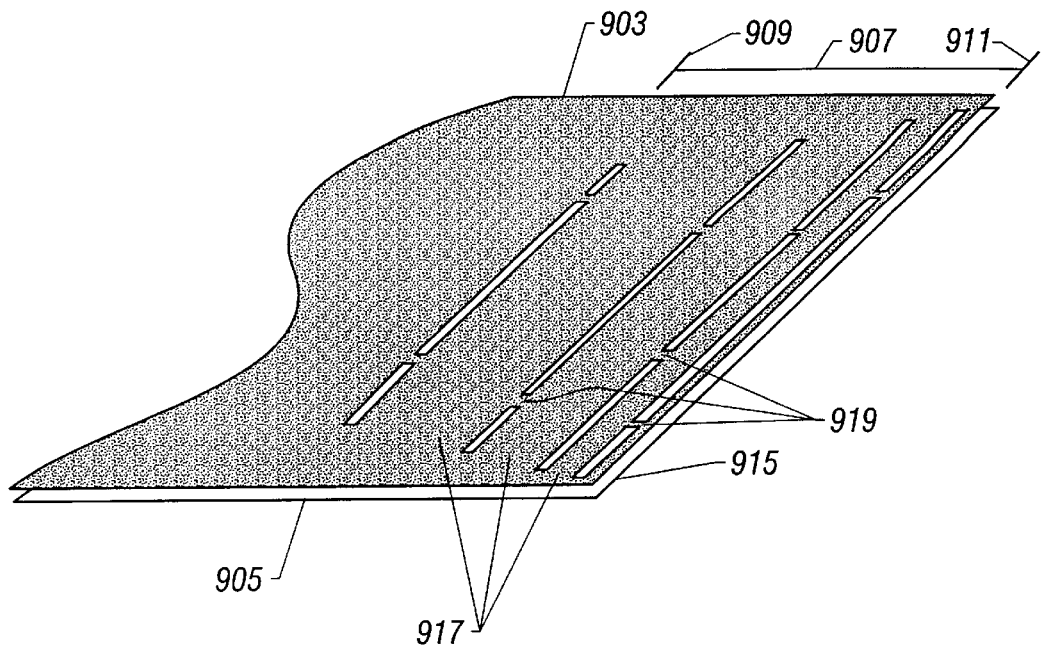
FIG. 9 is a perspective view of circuit board power planes according to the present invention.

FIG. 9 shows an example of a transition region having a striped geometric configuration. The stripes 917 of transition region 907 of the voltage plane 903 run parallel with edge 911 of transition region 907. The width of the stripes 917 decreases from the interior side 909 of the transition region to the edge side 911 of the transition region to provide a deliberate increase in impedance from the interior side 909 to the edge side 911. The impedance of each stripe can be calculated utilizing stripline or microstrip trace impedance formulas such as the formula shown below:

$$W \cong 2.5 * 10^{-2} \left[ \frac{\left(50 e^{(1.67*10^{-2})*Z*(\sqrt{\epsilon_r})} \right) *t - 2.99h}{\left(1.67*10^{-2} * Z * \sqrt{\epsilon_r}\right)} \right]$$

where $\epsilon_r$ is a constant specific to the type of dielectric material, h is the distance between the voltage and ground plane, and t is the thickness of a power plane. For one type of circuit board $\epsilon_r=4.1$, h=4 mils, and t=0.6 mils.

Furthermore, the shunt capacitance of each stripe combined with the series inductance of a small trace 919 (preferably copper with some boards) connecting each stripe in effect forms a multi-pole high frequency filter. See FIG. 7A. The change in width of the stripes from the board side to the edge side of the transition region may be varied to vary the desired rate of the deliberate increase in impedance. Also, the spacings between the stripes (width of the slots) may also be varied within a transition region to provide a deliberate increase in impedance.

Figure 10:
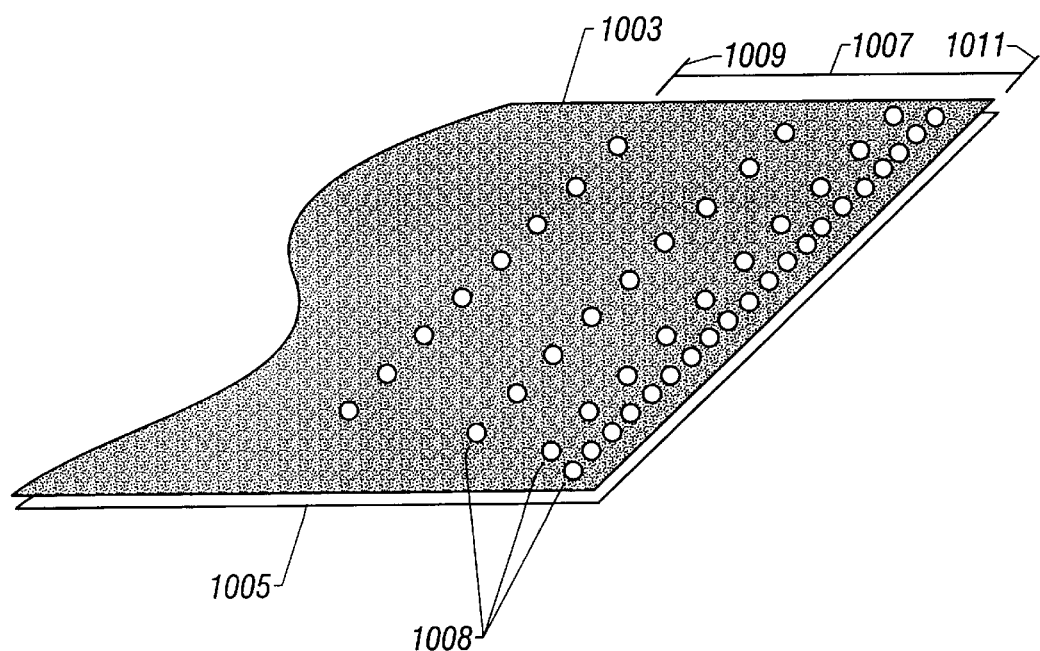
FIG. 10 is a perspective view of circuit board power planes according to the present invention.

FIG. 10 shows an example of a transition region having a hole or void geometric configuration. In FIG. 10, transition region 1007 includes rows of holes 1008 which are voids in the voltage plane 1003 material. The number of holes in a row, the length of a row, and the density of the rows all increase from the interior side 1009 of the transition region 1007 to the edge side 1011 of the transition region to provide a deliberate increase in the board impedance.

Figure 11:
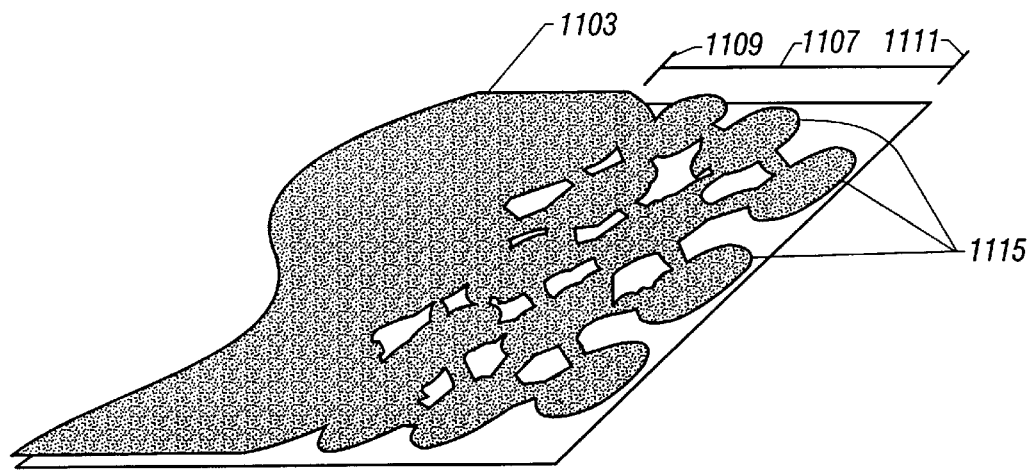
FIG. 11 is a perspective view of circuit board power planes according to the present invention.

FIG. 11 shows an example of a dot transition region. In FIG. 11, the transition region of the voltage plane 1103 is made up of connected dots 1115 that decrease in density from the interior side 1109 to the edge side 1111 of the transition region to provide a deliberate increase in the board impedance.

Figure 12:
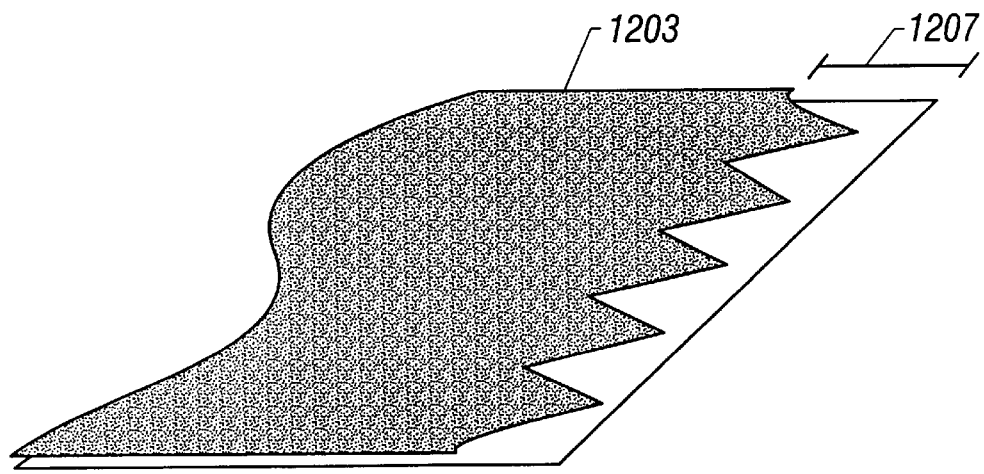
FIG. 12 is a perspective view of circuit board power planes according to the present invention.

FIG. 12 shows an example of a transition region having a triangle (or stealth) geometric configuration. Transition region 1207 includes a plurality of triangles having the bases positioned towards the interior of the voltage plane 1203 and the pointed ends positioned toward the edge of the voltage plane. The resultant edge of the voltage plane has a sawtooth form. The triangle shapes shown in FIG. 12 have straight slope edges. However, the slope edges may have other forms such as a logarithmic slope (see FIG. 14), a "stair-shaped" slope, or a stair-shaped logarithmic slope.

Figure 13:
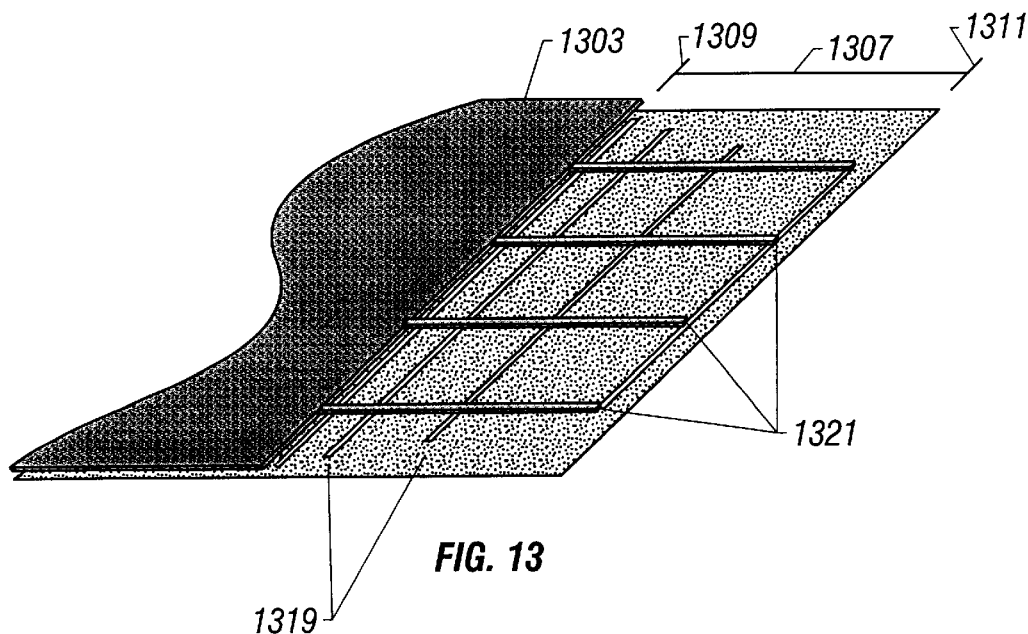
FIG. 13 is a perspective view of circuit board power planes according to the present invention.

FIG. 13 shows an example of a transition region having a grid geometric configuration. The grid configuration of FIG. 13 include a plurality of grid lines 1319 running parallel with the edge side 1311 of transition region 1307 and a plurality of grid lines 1321 ruling perpendicular to the edge side 1311. The parallel running grid lines 1319 decrease in density from the interior side 1309 to the edge side 1311 to provide a decrease in the density of the voltage plane 1303 from the interior side 1309 to the edge side 1311. Based on the teachings herein, those skilled in the art will appreciate that other grid configurations may be used to provide a deliberate increase in the impedance from the interior side to the edge side. For example, diagonal lines may be used. Furthermore, the grid lines 1321 running perpendicular to the edge side 1311 may extend from the interior of the voltage plane 1303 at varying lengths. Also, the widths of the transition region grid lines may decrease from the interior side to the edge side of a transition region.

Figure 14:
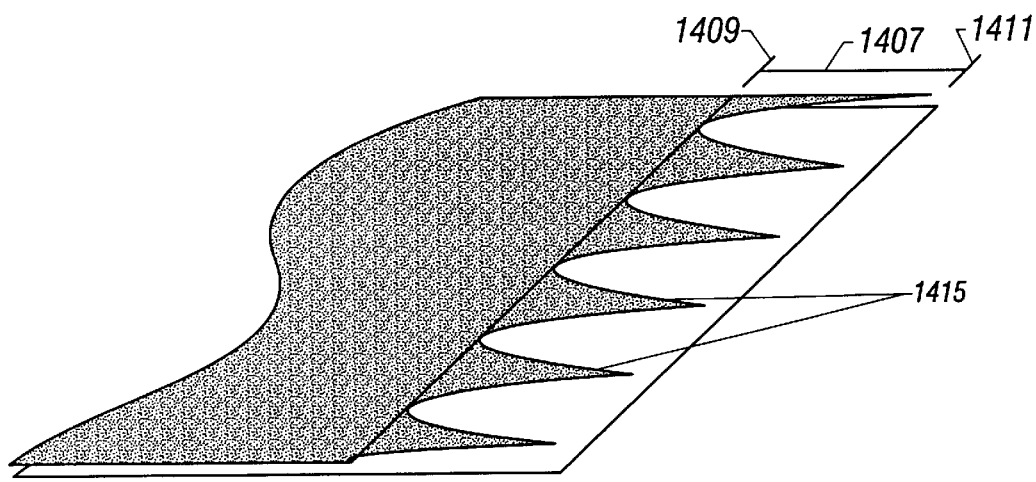
FIG. 14 is a perspective view of circuit board power planes according to the present invention.

FIG. 14 shows an example of a transition region having a logarithmic sloped triangle geometric configuration. The slopes 1415 of the triangles have a slope that follows a logarithmic function. An advantage of having a logarithmic slope is that the configuration provides the transition region with a deliberate increase in impedance that is exponential and thus more closely matches to the decline in RF current from the interior side 1409 to the edge side 1411 of the transition region. For example the power of the RF waves is:

$$P_{waves} = I^2_{RFcurrent} * Z_{board\ impedance}.$$

Being that the deliberate increase in impedance of transition region 1407 is exponential, the impedance increases at a faster rate at the interior side 1409 of the transition region 1407 than at the edge side 1411. Having a faster deliberate increase at the interior side and a slower deliberate increase at the edge side is advantageous in that the change in impedance at the interior side is more dramatic where the intensity of the RF current is greater. As the RF current reaches the edge side 1411, the slower change in the deliberate increase has a less adverse affect in that the strength of the RF current has significantly decreased at that point.

Figure 18:
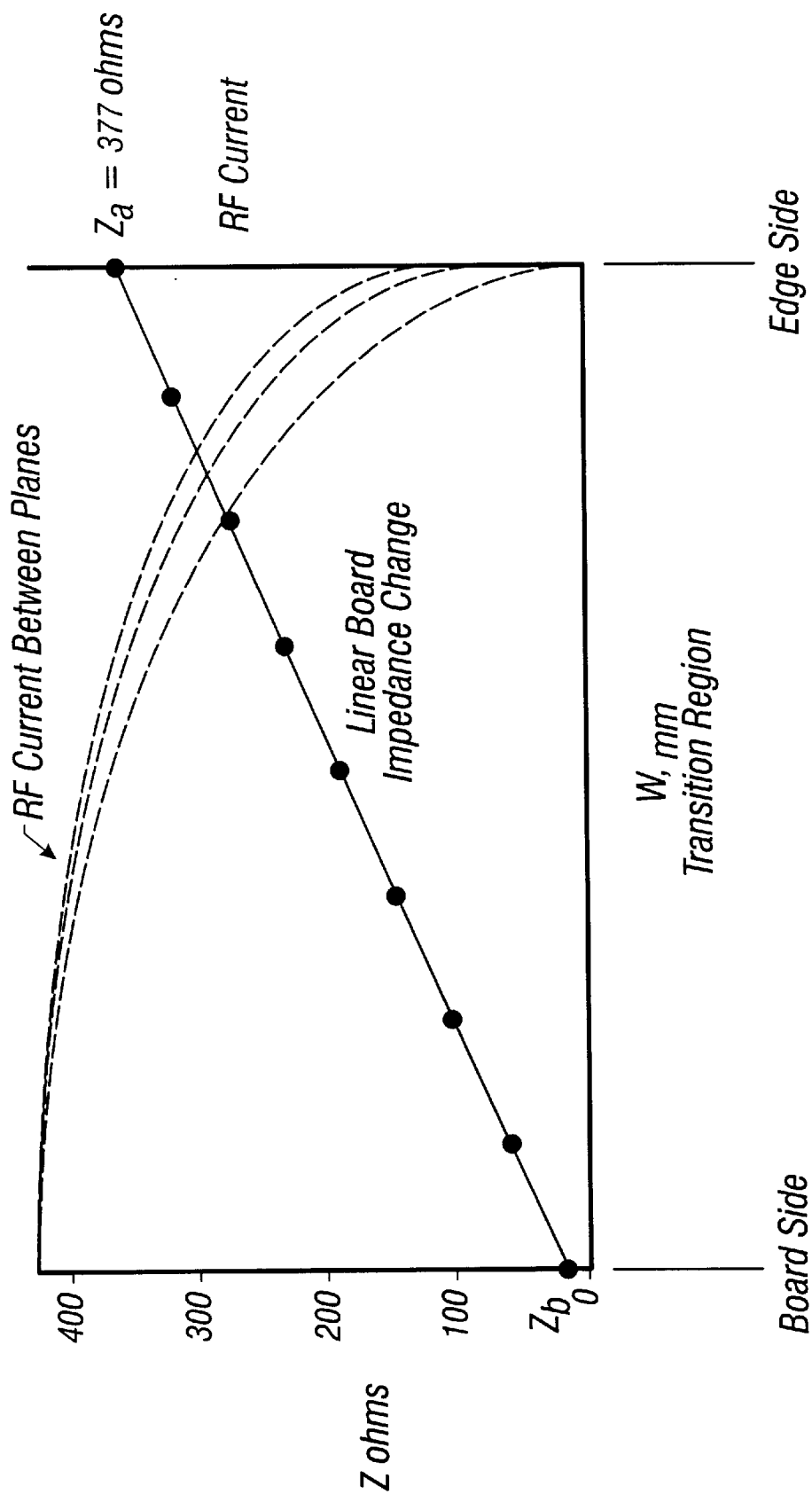
FIG. 18 is a graph showing a decrease in RF current across a transition region having a linear deliberate increase in impedance.

FIG. 18 is a graph showing a decrease in RF current across a transition region having a linear deliberate increase in impedance. From the board side to the edge side of the transition region, the RF current tapers off in a non linear manner. For a transition region of width w, a board impedance of $Z_b$, with $Z_a$ being the impedance of air, the linear change in impedance is:

$$\Delta_z \left( \frac{\Omega}{mm} \right) = \frac{377 - Z_b}{W_{(mm)}}$$

Figure 19:
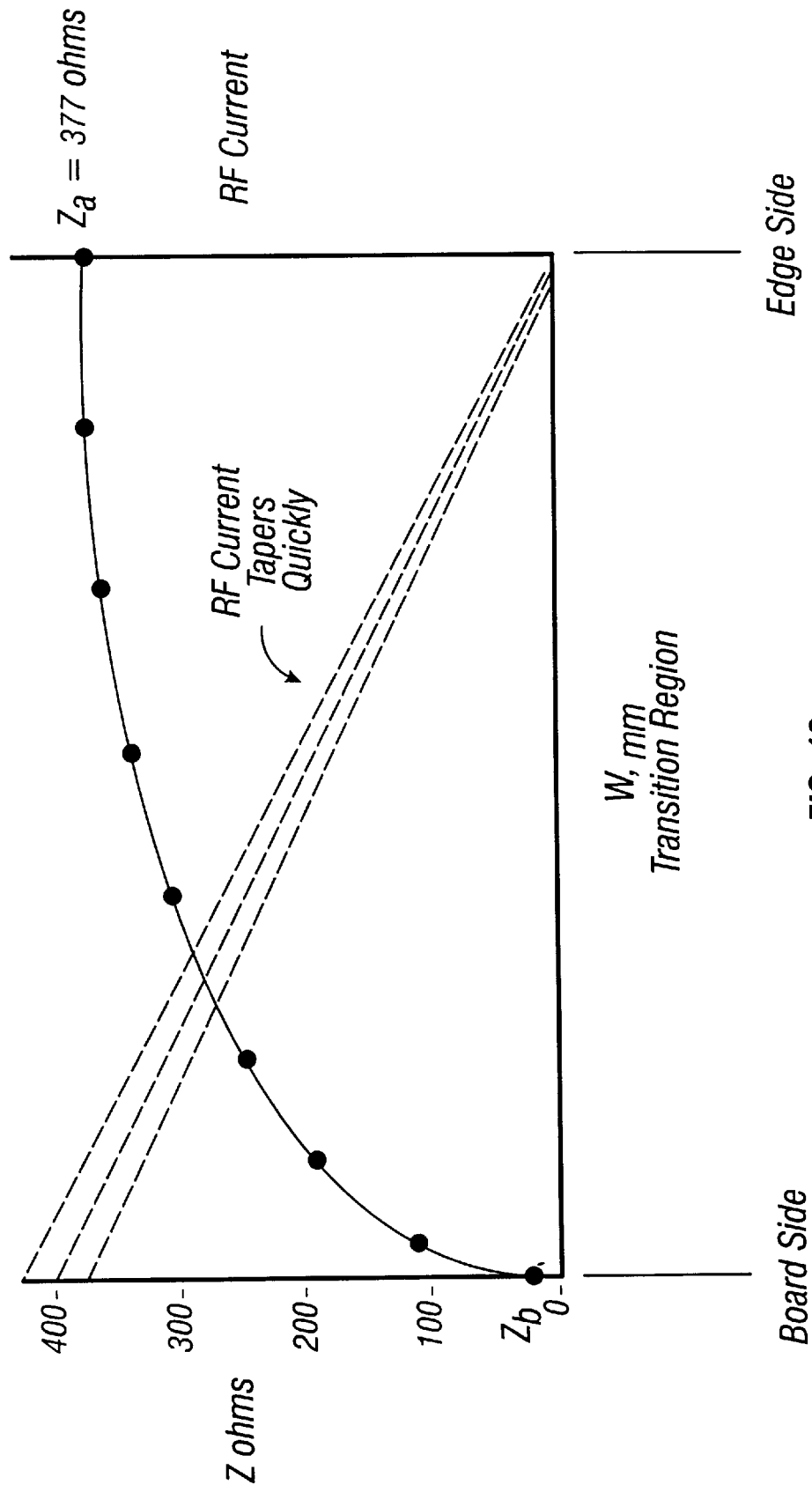
FIG. 19 is a graph showing a decrease in RF current across a transition region having a non linear deliberate increase in impedance.

FIG. 19 is a graph showing a decrease in RF current across a transition region having a non linear deliberate increase in impedance. For a non linear deliberate increase in impedance, the RF current tapers off in a faster, more linear fashion, which reduces reflections of RF waves inside the power planes of the circuit board.

The geometric configurations presented in FIGS. 8–14 are exemplary of geometric configurations that provide a deliberate increase in the board impedance in the transition region from the interior side to the edge side. Based upon the teachings presented herein, those skilled in the art will appreciate that other geometric configurations may be used to provide a transition region with a deliberate increase in board impedance.

Although FIGS. 8–14 show only one perimeter side of a voltage plane having a transition region, other circuit boards according to the present invention may include a transition region for each perimeter edge of the circuit board.

In one example of manufacturing a circuit board having a transition region(s), a foot print of the voltage plane having a transition region geometric configuration(s) is designed with the use of a Computer Assisted Design (CAD) program. The resultant foot print is then photo etched during a photolithography process onto a solid conductive layer (such as a 1 ounce copper layer having a thickness of 1.4 mills) covering a layer of dielectric material such as a 5 mil layer of prepreg or FR-4 fiber glass resin laminate. Additional layers of dielectric and conductive layers are then added to the initial voltage/ground structure. With circuit boards incorporating multiple voltage and ground layers (such as a circuit board incorporating capacitive planes), conductive and dielectric layer groups are conventionally formed separately and then sandwiched together to form a multi-layer circuit board. See the patent entitled "Printed Circuit Board (PCB) Including Channeled Capacitive Plane Structure", U.S. Pat. No. 5,912,809, filed on Jan. 21, 1997 and having a common assignee, which is hereby incorporated by reference in its entirety.

For circuit boards having multiple co-extensive voltage planes at multiple layers, each co-extensive voltage plane may have a transition region for each side located at the perimeter of the circuit board. For such circuit boards, a single ground plane may be closely positioned between two voltage planes both having transition regions on the voltage plane edges at the perimeter of the circuit board.

Some circuit boards incorporate multiple voltage planes in the same circuit board layer. For example, see the application entitled "Printed Circuit Board (PCB) Including Channeled Capacitive Plane Structure". Another example is a circuit board having a layer of multiple conductive patches at the same potential and electrically coupled together. For circuit boards having multiple voltage planes per layer, those voltage planes of the layer having edges at the perimeter of the circuit board would include a transition region having a deliberate increase in impedance for each perimeter side. However, with some circuit boards, all edges of a voltage plane, including those edges located in the interior of the circuit board adjacent to other voltage planes of the same layer, would also have a transition region.

The exemplary transition region configurations shown in FIGS. 8–14 have been shown incorporated with solid power planes. It is understood that a solid power plane may include via holes, drill holes, or other voids in the plane. However, the present invention may also be incorporated with other types of power planes such as cross hatch and slotted power planes. With these circuit boards, the density of the "non-solid" power plane material decreases from the interior side to the edge side of the transition region so as to provide a deliberate increase in the board impedance in accordance with the present invention. In one example of an embedded grid power plane, the spacings between the grid lines increase from the interior side to the edge side of the transition region.

A deliberate increase in impedance from an interior side to an edge side of a transition region of a circuit board may also be achieved by providing the portion of the ground plane extending into the transition region with a geometric configuration such as those shown in FIGS. 8–14.

Figure 15:
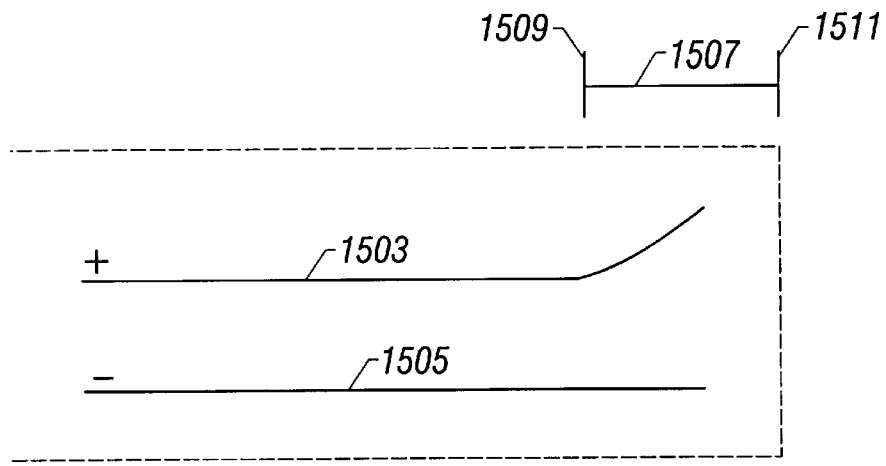
FIG. 15 is a side view of an alternative embodiment of a circuit board according to the present invention.

FIG. 15 represents an alternative embodiment for providing a circuit board with a transition region having a deliberate increase in impedance from the interior side to the edge side of the transition region according to the present invention. The deliberate increase in board impedance is achieved by providing an increase in the distance between the voltage 1503 and ground 1505 planes from the interior side 1509 to the edge side 1511 of the transition region 1507.

Figure 16:
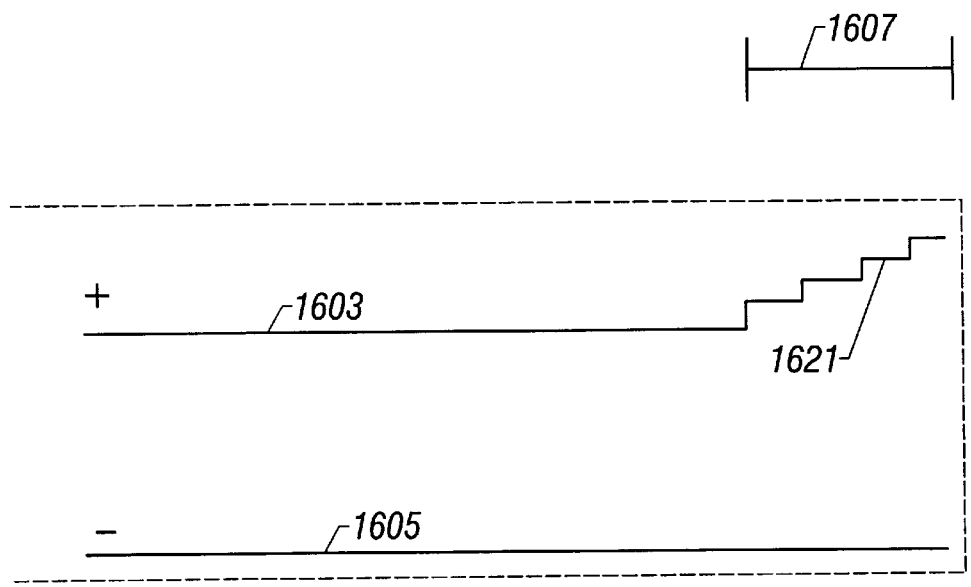
FIG. 16 is a side view of an alternative embodiment of a circuit board according to the present invention.

FIG. 16 is a side view of an exemplary circuit board according to the present invention having a deliberate increase in impedance from the interior side to the edge side of the transition region by proving an increase in the distance between the voltage plane and ground plane from the interior side to the edge side. The transition region portion 1607 of the voltage plane 1603 has a stair-step profile. Each horizontal (relative to the view shown in FIG. 16) layer of the transition portion of the voltage plane such as layer 1621 is formed by the successive etching of conductive layers during the formation of embedded trace layers located in an internal region of the circuit board. Each horizontal layer of the stair step is formed successively further away from ground plane 1605. Inter-planar vertical connections of the horizontal layers of the transition portion of the voltage plane are obtained by plated through holes, plated slots, or filled holes or slots interconnecting the horizontal layers. One advantage of the transition board of FIG. 16 is that the form of the effective slope of the transition region portion of the voltage plane can be more accurately controlled.

An increase between the voltage and ground planes can also be achieved by sloping the ground plane away from the voltage plane or by sloping both planes away from each other.

In other embodiments, a deliberate increase in the board impedance in the transition region from the interior side to the edge side is obtained by providing the portion of the dielectric layer located between the voltage and ground plane with a material having an increasing dielectric constant from the interior side of the transition region to the edge side of the transition region. The increase of the dielectric constant of the transition region portion of the dielectric layer provides a deliberate increase in the impedance between the voltage and ground planes.

Circuit boards including transition regions having a deliberate increase in board impedances according to the present invention may be utilized in a number of different types of computer systems and other types of electronic systems to reduce the EMI emissions of those systems. For example, such circuit boards may be used in desktop computers such as the OPTIPLEX sold by DELL COMPUTER CORP., portable computers (also referred to as notebook or laptop computers) such as the LATITUDE CP family of portable computers and the INSPIRON 3000, 3200, and 7000 portable computers sold by the DELL COMPUTER CORP., and servers such as the POWER EDGE 6300 sold by DELL COMPUTER CORP. These computer system types typically include a system processor and associated system memory (e.g. RAM) along with peripheral devices operably coupled to the system processor. The system processor typically is physically coupled to a circuit board such as a motherboard or a daughter card of the computer system. The motherboard, daughter card, and/or any other circuit boards incorporating power planes may include at their perimeters transition regions having a deliberate increase in impedance according to the present invention.

Figure 17:
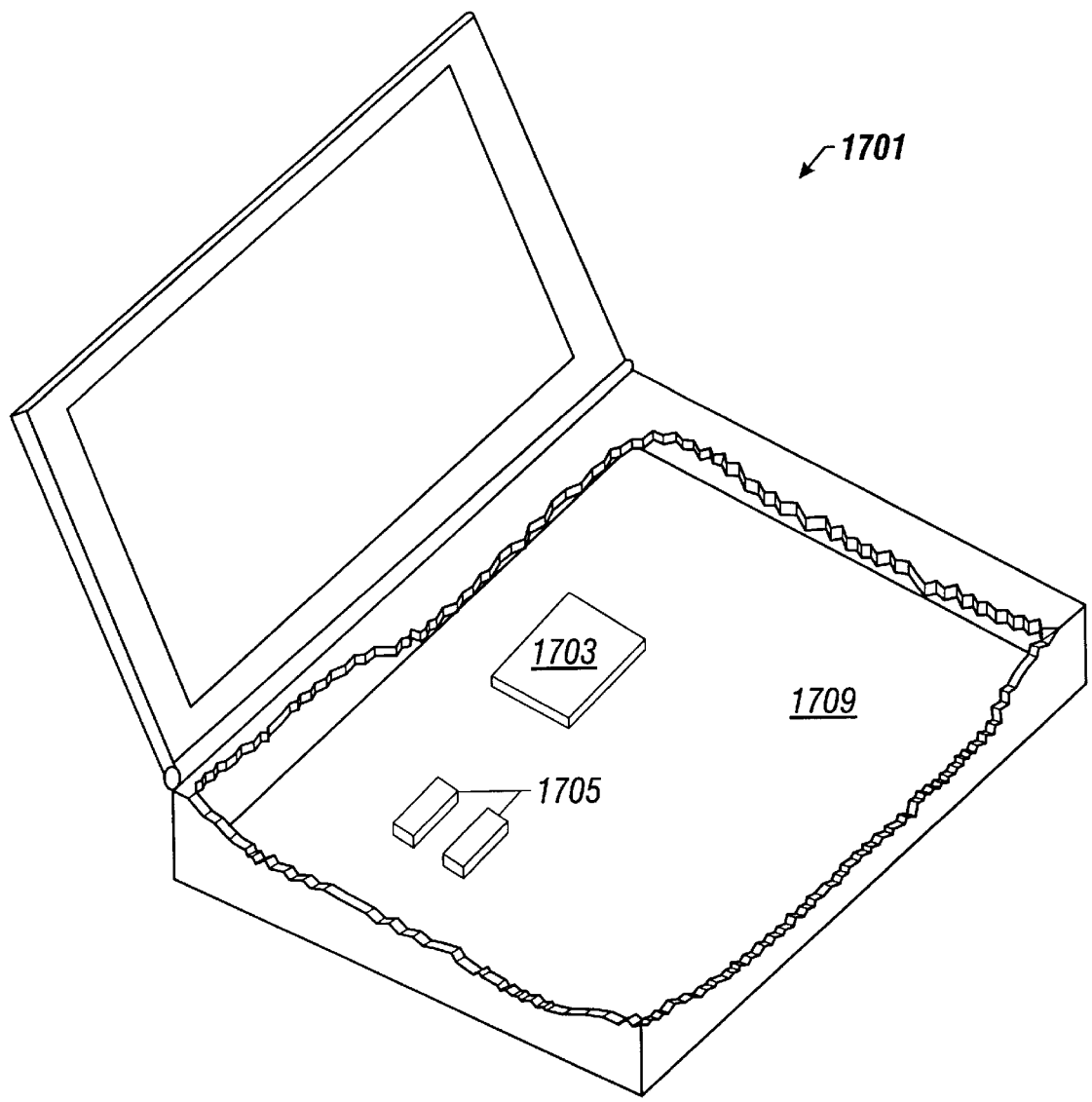
FIG. 17 is a perspective, cutaway view of a computer system according to the present invention.

FIG. 17 shows a perspective, cutaway view of a portable computer system incorporating a circuit board having a transition region according to the present invention. Portable computer system 1701 includes a system processor 1703 and system memory DRAM chips 1705 mounting to circuit board 1709. The edges of the circuit board include transition regions having deliberate increases in board impedances from a board impedance value at the interior of the circuit board towards a board impedance value of surrounding air. Not shown in FIG. 17 are items typically found in a portable computer system such as a keyboard, power supply, I/O controllers, and other integrated circuits, some of which are mounted to circuit board 1709.

While particular embodiments of the present invention have been shown and described, it will be obvious to those skilled in the art that, based upon the teachings herein, changes and modifications may be made without departing from this invention and its broader aspects and, therefore, the appended claims are to encompass within their scope all such changes and modifications as are within the true spirit and scope of this invention.

What is claimed is:

1. A circuit board comprising:

a first conductive plane;

a second conductive plane, an impedance between the first conductive plane and the second conductive plane at an interior region of the first conductive plane is at a first impedance level;

means for providing a deliberate increase in the impedance between the first conductive plane and the second conductive plane at a transition region located along an edge of the circuit board from approximately the first impedance level towards the impedance level of surrounding air so as to reduce intensity of electromagnetic waves generated from an edge of the circuit board.

2. A circuit board comprising:

a first power plane;

a second power plane, an impedance between the first power plane and the second power plane at an interior region of the circuit board is at a first impedance level;

a transition region located along an edge of the circuit board, the transition region having an interior side and an edge side, portions of the first and second power planes extending into the transition region, the impedance between the first power plane and the second power plane having a deliberate increase from approximately the first impedance level at the interior side of the transition region to a higher impedance level at the edge side of the transition region so as to reduce intensity of electromagnetic waves generated from the edge of the circuit board.

3. The circuit board of claim 2 wherein the impedance between the first power plane and the second plane has a deliberate increase from approximately the first impedance level towards an impedance value of surrounding air at the edge side of the transition region.

4. The circuit board of claim 2 wherein:
the portion of the first power plane extending into the transition region has a geometric configuration to provide the deliberate increase in the impedance between the first power plane and the second power plane.

5. The circuit board of claim 4 wherein the geometric configuration provides the portion of the first power plane extending into the transition region with a decrease in density of plane material from the interior side of the transition region to the edge side of the transition region.

6. The circuit board of claim 2 wherein the distance between the first power plane and the second power plane increases from the interior side to the edge side of the transition region.

7. The circuit board of claim 2 further comprising:
a dielectric layer positioned between the first power plane and the second power plane, the dielectric constant of the dielectric layer increasing from the interior side of the transition region to the edge side of the transition region.

8. The circuit board of claim 2 wherein:
the second power plane is an embedded ground plane;
the first power plane is an embedded voltage plane positioned substantially parallel to the ground plane, the embedded voltage plane for providing a voltage potential to electronic components mounted on the circuit board.

9. The circuit board of claim 2 further comprising:
a second transition region located along a second edge of the circuit board, the second transition region having an interior side and an edge side, portions of the first and second power planes extending into the second transition region, the impedance between the first power plane and the second power plane having a deliberate increase from approximately a first impedance level at the interior side of the second transition region to a higher impedance level at the edge side of the second transition region so as to reduce intensity of electromagnetic radiation radiated from the second edge of the circuit board.

10. The circuit board of claim 2 wherein the second power plane extends out further into the transition zone than the first power plane.

11. The circuit board of claim 2 wherein the deliberate increase is generally linear.

12. The circuit board of claim 2 wherein the deliberate increase is non linear.

13. The circuit board of claim 2 wherein the deliberate increase is from approximately the first impedance level to an impedance level that is at least slightly less than the impedance level of surrounding air.

14. The circuit board of claim 2 wherein the deliberate increase is from approximately the first impedance level to an impedance level that is at least somewhat less than the impedance level of surrounding air.

15. A circuit board comprising:
a first conductive plane;
a second conductive plane, an impedance between the first conductive plane and the second conductive plane at an interior region of the first conductive plane is at a first impedance level;
wherein the first conductive plane further includes:
a transition region located at an edge region of the first conductive plane adjacent to the interior region, the transition region having a geometric configuration for providing a deliberate increase in the impedance between the first conductive plane and the second conductive plane from approximately the first impedance level towards a higher impedance level.

16. The circuit board of claim 15 wherein the geometric configuration provides the transition region with a decreasing density of plane material from an interior side of the transition region to an edge side of the transition region.

17. The circuit board of claim 15 wherein the geometric configuration includes a plurality of triangles having bases and points, wherein the bases of the plurality of triangles are positioned towards an interior region of the first conductive plane and the points are positioned towards the edge of the first conductive plane.

18. The circuit board of claim 17 wherein the edge region of the first conductive plane has a generally saw-tooth form.

19. The circuit board of claim 15 wherein the geometric configuration of the transition region defines a plurality of holes, wherein the holes increase in density from an interior side of the transition region to an edge side of the transition region.

20. The circuit board of claim 19 wherein the plurality of holes defined in the transition region are arranged in a plurality of rows running generally parallel to an edge of the first conductive plane.

21. The circuit board of claim 15 wherein the geometric configuration of the transition region defines a plurality of slots, wherein the slots increase in density from an interior side of the transition region to an edge side of the transition region.

22. The circuit board of claim 21 wherein the plurality of slots run generally parallel to the edge side of the first conductive plane, the length of the slots increasing from the interior side of the transition region to the edge side of the transition region.

23. The circuit board of claim 15 wherein the geometric configuration of the transition region includes a plurality of stripes, each having a width, wherein the widths of the stripes decrease from an interior side of the transition region to an edge side of the transition region.

24. The circuit board of claim 15 wherein the geometric configuration includes a grid configuration, the density of the grid configuration decreasing from an interior side of the transition region to an edge side of the transition region.

25. The circuit board of claim 15 wherein the geometric configuration includes a plurality of triangle-like structures having logarithmically defined slopes extending from bases of the triangle-like structures towards points of the triangle-like structures, the bases of the triangle-like structures positioned towards an interior side of the transition region and the points of the triangle like structure positioned towards an edge side of the transition region.

26. The circuit board of claim 15 wherein the circuit board has first and second planar sides, the second conductive plane is embedded in the circuit board and is substantially co-extensive with the first and second planar sides.

27. The circuit board of claim 15 wherein the first and second conductive planes are embedded.

28. The circuit board of claim 15 wherein the deliberate increase in impedance in the transition region provides a greater than 30 dB decrease in electromagnetic waves generated from the edge of the circuit board.

29. The circuit board of claim 15 wherein the first conductive plane is a voltage plane and the second conductive plane is a ground plane.

30. The circuit board of claim 15 further comprising:

a third conductive plane, an impedance between the third conductive plane and the second conductive plane at an interior region of the third conductive plane is at an impedance level;

wherein the third conductive plane further includes:

a transition region located at an edge region of the third conductive plane adjacent to the interior region of the third conductive plane, the transition region having a geometric configuration for providing a deliberate increase in the impedance between the third conductive plane and the second conductive plane from approximately the impedance level towards the impedance level of surrounding air.

31. The circuit board of claim 15 wherein the transaction region has a deliberate increase in the impedance level between the first conductive plane and the second conductive plane from approximately the first impedance level towards an impedance level of surrounding air.

32. The circuit board of claim 31 wherein the deliberate increase is from approximately the first impedance level to an impedance level that is at least slightly less than the impedance level of surrounding air.

33. The circuit board of claim 15 wherein the edge region is located along an edge of the circuit board wherein the impedance between the first power plane and the second power plane has a deliberate increase from approximately the first impedance level at an interior side of the transition region to an impedance level of at least slightly less than surrounding air at the edge of the circuit board so as to reduce intensity of electromagnetic waves generated from the edge of the circuit board.

34. The circuit board of claim 15 wherein the deliberate increase is from approximately the first impedance level to an impedance level that is at least somewhat less than the impedance level of surrounding air.

35. A computer system having a processor and a system memory comprising:

a circuit board including:

a first power plane;

a second power plane, an impedance between the first power plane and the second power plane at an interior region of the circuit board is at a first impedance level;

a dielectric layer positioned between the first power plane and the second power plane;

a transition region located along an edge of the circuit board, the transition region having an interior side and an edge side, portions of the first and second power planes extending into the transition region, the impedance between the first power plane and the second power plane having a deliberate increase from approximately the first impedance level at the interior side of the transition region to a higher impedance level at the edge side of the transition region so as to reduce intensity of electromagnetic waves generated from the edge of the circuit board.

36. The computer system of claim 35 wherein the first power plane is a voltage plane and the second power plane is a ground plane, the voltage plane providing a voltage potential to the system processor.

37. The computer system of claim 35 wherein the computer system is a portable computer system.

38. The computer system of claim 35 wherein the system processor is physically coupled to the circuit board.

39. The computer system of claim 35 wherein:

the portion of the first power plane extending into the transition region has a geometric configuration to provide the deliberate increase in the impedance between the first power plane and the second power plane.

40. The computer system of claim 39 wherein the geometric configuration provides the portion of the first power plane extending into the transition region with a decrease in density of plane material from the interior side of the transition region to the edge side of the transition region.

41. The computer system of claim 35 wherein:

the second power plane is an embedded ground plane;

the first power plane is an embedded voltage plane positioned substantially parallel to the ground plane.

42. The computer system of claim 35 wherein the deliberate increase is from approximately the first impedance level to an impedance level that is at least slightly less than the impedance level of surrounding air.

43. The computer system of claim 35 wherein the deliberate increase is from approximately the first impedance level to an impedance level that is at least somewhat less than the impedance level of surrounding air.

* * * * *